United States Patent
Kubena et al.

(10) Patent No.: US 7,282,834 B2
(45) Date of Patent: Oct. 16, 2007

(54) MICRO ELECTRICAL MECHANICAL SYSTEM (MEMS) TUNING USING FOCUSED ION BEAMS

(75) Inventors: Randall L. Kubena, Oak Park, CA (US); Richard J. Joyce, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 165 days.

(21) Appl. No.: 11/148,389

(22) Filed: Jun. 7, 2005

(65) Prior Publication Data

US 2005/0269901 A1    Dec. 8, 2005

Related U.S. Application Data

(62) Division of application No. 10/286,375, filed on Nov. 1, 2002, now Pat. No. 6,922,118.

(51) Int. Cl.
    *H01L 41/08* (2006.01)
(52) U.S. Cl. ...................................... 310/312
(58) Field of Classification Search ............... 310/312, 310/321, 328
    See application file for complete search history.

(56) References Cited

U.S. PATENT DOCUMENTS

| | | | |
|---|---|---|---|
| 392,650 A | 11/1888 | Watrous | 56/433 |
| 3,879,992 A * | 4/1975 | Bartera | 73/24.01 |
| 3,969,640 A * | 7/1976 | Staudte | 310/312 |
| 4,092,588 A | 5/1978 | Desormiere et al. | 324/727 |
| 4,561,286 A * | 12/1985 | Sekler et al. | 73/24.06 |
| 5,226,321 A | 7/1993 | Varnham et al. | 73/505 |
| 5,283,037 A * | 2/1994 | Baer et al. | 422/82.01 |
| 5,334,303 A * | 8/1994 | Muramatsu et al. | 204/412 |
| 5,407,525 A | 4/1995 | Michel et al. | 216/59 |
| 5,580,419 A | 12/1996 | Berenz | 156/628.1 |
| 5,646,346 A | 7/1997 | Okada | 73/504.04 |
| 5,662,782 A | 9/1997 | Gomi et al. | 204/192.34 |
| 5,665,915 A | 9/1997 | Kobayashi et al. | 73/512.32 |

(Continued)

FOREIGN PATENT DOCUMENTS

DE    44 42 033 A1    5/1996

(Continued)

OTHER PUBLICATIONS

Barbour, N., et al., "Micromechanical Silicon Instrument and Systems Development at Draper Laboratory," *AIAA Guidance Navigation and Control Conference*, American Institute of Aeronautics and Astronautics, San Diego, CA, Paper No. 96-3709, pp. 1-7 (Jul. 29-31, 1996).

(Continued)

*Primary Examiner*—Mark Budd
(74) *Attorney, Agent, or Firm*—Ladas & Parry

(57) ABSTRACT

A method for tuning an electro-mechanical device such as a MEMS device is disclosed. The method comprises operating a MEMS device in a depressurized system and using FIB micromachining to remove a portion of the MEMS device. Additionally, a method for tuning a plurality of MEMS devices by depositing an active layer and then removing a portion of the active layer using FIB micromachining. Also, a method for tuning a MEMS device and vacuum packaging the MEMS device in situ are provided.

9 Claims, 6 Drawing Sheets

U.S. PATENT DOCUMENTS

| | | | |
|---|---|---|---|
| 5,705,399 A * | 1/1998 | Larue | 436/501 |
| 5,728,583 A * | 3/1998 | Kawakami et al. | 436/69 |
| 5,783,749 A | 7/1998 | Lee et al. | 73/504.12 |
| 5,894,090 A | 4/1999 | Tang et al. | 73/504.02 |
| 5,905,202 A | 5/1999 | Kubena et al. | 73/504.15 |
| 5,920,012 A | 7/1999 | Pinson | 73/504.12 |
| 5,932,953 A * | 8/1999 | Drees et al. | 310/324 |
| 6,009,751 A | 1/2000 | Ljung | 73/504.02 |
| 6,044,705 A | 4/2000 | Neukermans et al. | 73/504.02 |
| 6,114,795 A * | 9/2000 | Tajima et al. | 310/312 |
| 6,164,134 A | 12/2000 | Cargille | 73/504.02 |
| 6,232,846 B1 | 5/2001 | Hirano et al. | 331/107 A |
| 6,289,733 B1 | 9/2001 | Challoner et al. | 73/504.12 |
| 6,367,786 B1 | 4/2002 | Gutierrez et al. | 267/136 |
| 6,462,460 B1 * | 10/2002 | Tikka et al. | 310/312 |
| 6,515,278 B2 | 2/2003 | Wine et al. | 250/234 |
| 6,570,468 B2 | 5/2003 | Ma et al. | 333/188 |
| 6,629,460 B2 | 10/2003 | Challoner | 73/504.02 |
| 6,698,287 B2 | 3/2004 | Kubena et al. | 73/504.12 |
| 6,922,118 B2 * | 7/2005 | Kubena et al. | 333/188 |
| 6,975,184 B2 * | 12/2005 | Wang et al. | 333/188 |

FOREIGN PATENT DOCUMENTS

| | | |
|---|---|---|
| WO | 96/38710 | 12/1996 |
| WO | 98/15799 | 4/1998 |

OTHER PUBLICATIONS

Daniel, J.H., et al., "Focused Ion Beams for Microfabrication," *Institution of Electrical Engineers Colloquium Digest No. 1997/081*, pp. 9/1-9/6 (Nov. 1997).

Duwel, A., et al., "Quality Factors of MEMS Gyros and the Role of Thermoelastic Damping," *IEEE*, pp. 214-219 (Jan. 20-24, 2002).

"IJT: Ink Jet Technology Inc.," *Basic Evaluation Kit*, Rev. 1.0, 1 page. Internet: <www.INKJET-TECH.com>.

Johnson, J.D., et al., "Surface Micromachined Angular Rate Sensor," *SAI Conference*, Paper No. 950538, pp. 77-83 (1995).

Putty, M.W., et al., "A Micromachined Vibrating Ring Gyroscope," *Solid-State Sensor and Actuator Workshop*, pp. 213-220 (Jun. 13-16, 1994).

Syms, R.R.A. and D.R. Moore, "Focused Ion Beam Tuning of In-Plane Vibrating Micromechanical Resonators," *Electronics Letters*, vol. 35, No. 15, pp. 1277-1278 (Jul. 1999).

Tang, T.K., et al., "Silicon Bulk Micromachined Vibratory Gyroscope," *Solid State Sensor and Actuator Workshop*, Transducer Research Foundation, Hilton Head, South Carolina, 6 pages (Jun. 2-6, 1996).

Weinberg, M., et al., "Microelectromechanical Instrument and Systems Development at the Charles Stark Draper Laboratory, Inc.," *IEEE*, pp. 8.5-33--8.4-40 (Oct. 26-30, 1997).

Wright, D., et al., "The HRG Applied to a Satellite Attitude Reference System," *Guidance and Control*, American Astronautical Society, Advances in Astronautical Sciences, pp. 1-13 (1994).

* cited by examiner

MICRO ELECTRICAL MECHANICAL SYSTEM (MEMS) TUNING USING FOCUSED ION BEAMS

CROSS REFERENCE TO RELATED APPLICATIONS

This patent application is a divisional application of U. S. application Ser. No. 10/286,375, filed on Nov. 1, 2002, now U. S. Pat. No. 6,922,118 which application is related to the application document entitled "Microgyro Tuning Using Focused Ion Beams," U. S. Ser. No. 10/285,886, filed Nov. 1, 2002, now U.S. Pat. No. 6,698,287. The contents of this related patent are hereby incorporated by reference herein.

FIELD OF THE INVENTION

The present invention relates to a method for tuning an electro-mechanical device. More specifically, the present invention relates to a method for tuning a MEMS device in real time using a focused ion beam (FIB) without degrading the performance of the device.

BACKGROUND OF THE INVENTION

Many MEMS devices require that their mechanical resonant frequencies are matched to system requirements or to other on-chip frequencies. Examples of these requirements are UHF resonators for RF signal processing, channel selection, and "on-resonant" operation of arrays of resonators for chemical or biological sensors. Each resonator should be tuned to the pre-selected frequency used in order to properly receive the signal. In the case of resonators to be used with chemical or biological sensors, an array of resonators with frequencies in the 100 MHz to 1 GHz range should ideally have nearly matched resonant frequencies since differential detection of small changes in the frequencies due to molecular attachment are more easily measured without large offsets in frequency. In some digital radio applications, thousands of individual channels in the 100 MHz range should be matched to the broadcast frequencies with an accuracy of several kilohertz. Since fabrication tolerances are typically about 1% for most IC fabrication techniques, processing errors from etching and lithography techniques can far exceed the resonant linewidths or channel accuracy required for high Q oscillators. Therefore, etching and lithography do not provide the accuracy necessary for high frequency MEMS resonators.

Previously, most MEMS resonators have been tuned using electrostatic biases applied to the resonators, thus lowering the resonant frequency through a negative spring effect. This technique has been used for a nickel (Ni) ring gyro reported at the "Solid-State Sensor and Actuator Workshop," Hilton Head, S.C., Jun. 13-16, 1994, pp. 213-220.

However, the electrostatic bias technique has a limited tuning range since the bias voltages applied to the resonators deflect the structure of the resonators and cannot be raised to high levels due to limitations on the electronics. Additionally, this biasing technique can lead to drift over time and temperature, if the biasing source changes with time or temperature. Furthermore, the electrostatic bias technique can lead to additional energy losses to the support circuitry and therefore a low overall Q of the system. Moreover, electrostatic tuning cannot mass balance a system to minimize momentum losses to the support structure. Hence, a method to mechanically tune a MEMS resonator both for frequency adjustment and for Q optimization is desired.

In order to solve the problems associated with tuning MEMS devices using electrostatic biases, laser assisted etching techniques have been utilized to mechanically tune MEMS gyros. The Draper double tuning fork gyro is an example of a device tuned with this technique. However, laser assisted etching has less spatial resolution for nanometer structures and cannot control the removal of material on a sub-monolayer scale. In addition, laser systems can cause damage or drift of the structure due to heating effects, and require additional equipment for accurately removing material on the micron scale. This is discussed in M. Weinberg, J. Connely, A. Kourepenis, D. Sargent, "Microelectromechanical Instrument and Systems Development at the Charles Stark Draper Laboratory, Inc." Also, laser assisted etching and chemically assisted etching systems can produce debris which may prevent the MEMS structure from moving or cause reactions with metals or other device features of the MEMS structure. This is discussed in Amy Duwell, Marcie Weinstein, John Gorman, Jeff Borenstein, Paul Ward, "Quality Factors of MEMS Gyros And The Role Of Thermoelastic Damping."

In general, for commercial high volume applications, the tuning and adjustment time must be on the order of 1 second for high throughput. If the adjustment time is significantly larger than 1 second per device, the cost of manufacturing will be increased. Since air damping can affect the parameters of MEMS resonators, the tuning technique must be performed in a reasonably good vacuum ($10^{-4}$ to $10^{-6}$ Torr) for most MEMS devices. Therefore, there is a need for a method which can reliably tune many MEMS devices in a short period of time in a vacuum. This can be best accomplished by tuning a small or "nano" MEMS device on a wafer before packaging, using a sub-micrometer vector scan beam system emitting a focused ion beam.

Therefore, a need arises to provide a method which can reliably and cleanly tune a MEMS device in real time with sub-micron accuracy. Furthermore, there is a need for a method which can reliably tune many MEMS devices in a short period of time in a vacuum.

SUMMARY OF THE INVENTION

The present invention solves the aforementioned problems and meets the aforementioned needs by providing a method for tuning a small or "nano" electro-mechanical device, such as a MEMS device with feature sizes on the order of less than several hundred micrometers, in real-time using focused-ion-beam (FIB) micromachining. FIB micromachining involves bombarding a device in a vacuum with a beam of heavy ions. When the ions collide with the MEMS device, the ions remove material from the MEMS device through sputtering. The amount of material removed from the device can be controlled by adjusting the number of ions which bombard the MEMS device or the energy of the ions in the beam. The ion dose can be controlled by scanning the focused ion beam across the scan field line using electrostatic deflection of the beam.

The advantage of FIB micromachining over laser techniques is that 1) FIB micromachining is a clean process that produces virtually no debris; 2) FIB micromachining has submicron resolution and registration accuracy; 3) FIB micromachining allows the removal of very precise amounts of material; and 4) FIB micromachining produces no substantial heating of the substrate.

Since FIB micromachining has excellent spatial resolution (in the nanometer regime) for removing small regions of material, it is ideally suited for "nano" resonator MEMS device applications, i.e. high frequency (>1 MHz) devices. In addition, FIB micromachining provides a clean and well controlled method of removing sub-monolayer thickness of material from a MEMS device.

As the dimensions of MEMS structures are reduced, the frequency of oscillations typically increases. Accordingly, the method of the present invention is preferably useful for high frequency (>1 MHz), resonators. In many cases only 1 millisecond of micromachining is needed to correct common lithography or deposition variations and produce a 1% change in the resonant frequency. Lower frequency resonators that are considerably larger than 100 micrometers in linear dimensions will require longer exposure times to the FIB for a given percentage change in characteristics, and therefore their manufacturing costs will increase.

In order to perform FIB micromachining in accordance with the present invention, a MEMS device is preferably placed in a depressurized system in order to reduce ion scattering from air molecules. While in the depressurized system, the MEMS device may or may not be operating, but it is preferred that the MEMS device is operating. If the device is operating the output of the device can be monitored as the FIB is removing material from the device. Once the pressure is taken down to a certain level ($\leq 10^{-4}$ torr), the focused ion beam is directed at the MEMS device to remove a portion of at least one layer of the MEMS device with high spatial accuracy. The modifications on MEMS device by use of FIB micromachining is stable over time. This provides the ability to tune the resonant frequency or the Q, with high precision.

A further object of the present invention is to provide a circuit card containing buffer electronics which is coupled to the MEMS device. By preferably coupling buffer electronics to conductive regions on the MEMS device in the depressurized system, the FIB micromachining method according to the present invention can be performed in-situ in real-time while the MEMS device is operating without degrading the performance of the MEMS device. Furthermore, the output frequency of the device can be monitored in real time so that when the desired resonant frequency is achieved, the FIB micromachining stops.

It is also an object of the present invention to provide a method by which a plurality of MEMS devices can be simultaneously covered with active layers of material for detecting chemical and biological agents. The active layers are material which, when in contact with a specific chemical or biological agent, will bond with that agent. This bond increases the mass of the MEMS device, thereby changing the resonant frequency, indicating the presence of that specific chemical or biological agent. After the active layers are deposited, the plurality of MEMS devices may be exposed to the focused ion beam in order to ensure that each MEMS device in the plurality of MEMS devices has roughly the same resonant frequency for input into differential detectors.

It is also an object of the present invention to provide a system for tuning a plurality of MEMS devices and packaging the MEMS devices in-situ. The present invention provides a vacuum transport system which is coupled to the depressurized system in which the FIB micromachining is performed. After the plurality of wafers are tuned, the vacuum transport system couples the tuned wafer to a wafer bonding system, where the wafers are bonded with a capping wafer. This allows the resonator to be tuned and packaged in-situ.

As a result, the present invention provides a method which can quickly and cleanly tune a MEMS device. Furthermore, the method of the present invention can be readily implemented in a system which can automate the tuning process for many devices.

DETAILED DESCRIPTION OF THE INVENTION

The present invention will now be described more fully hereinafter with reference to the accompanying drawings, in which embodiments of the invention are shown. This invention may be embodied in many different forms and should not be construed as limited to the embodiments set forth herein.

FIRST EMBODIMENT

A method and apparatus for tuning an electro-mechanical device such as a MEMS device according to a first and preferred embodiment of the present invention are described with reference to FIGS. 1-3. The MEMS device could be any resonator. The resonator can, for example, be shaped like a tuning fork, microstrip, or any other bulk or surface acoustic wave device. Because FIB micromachining is ideal for submicron applications, such micromachining is preferably used for tuning resonators with a resonant frequency roughly greater than 1 MHz. Resonators having resonant frequencies less than 1 MHz can have linear dimensions orders of magnitude larger than the micron scale, and therefore, tuning would require the removal of significant amounts of material. This would require a significant amount of time as FIB micromachining is typically used for removing small amounts of material. However, those skilled in the art will realize that this technique is applicable for tuning resonators having linear dimensions orders of magnitude larger than the micron scale, and having resonant frequencies less than 1 MHz.

Figure 1:
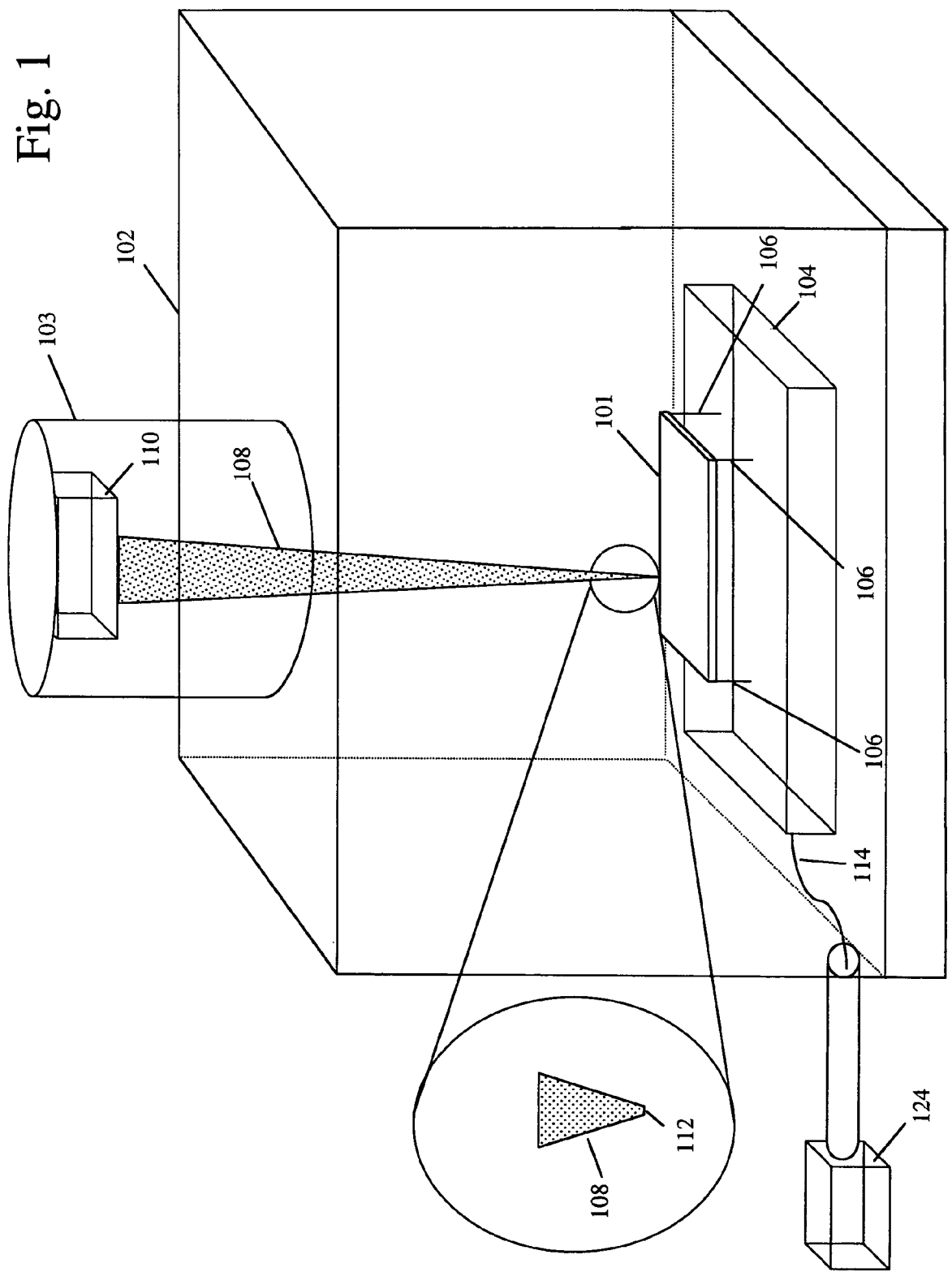
FIG. 1 shows a schematic view of the system used according to a first embodiment of the present invention.

FIG. 1 shows a first embodiment of the present invention. A generic resonator 101 is placed inside a specimen chamber 102 as shown in FIG. 1. The specimen chamber 102 contains a cylinder 103 which houses a liquid metal (LM) source 110 for emitting a focused ion beam 108. Those skilled in the art will appreciate that other types of focused ion beam sources may also be used. For example, one such specimen chamber 102 containing a LM source for emitting a focused ion beam 108 is the FIB Micron from the FEI company. The focused ion beam 108 is used to remove material from the resonator 101, thus tuning the resonator 101. The resonator 101 is electrically coupled with leads 106 to buffer electronics located on a circuit card 104. The resonator 101 can be comprised of silicon, aluminum-nitride, silicon-carbide, gallium-nitride, quartz, or other variations of semiconductor material. The resonator 101 preferably has a resonant frequency greater than 1 MHz, and preferably has linear dimensions no greater than 100 micrometers. The circuit card 104 is located no more than a few centimeters from the resonator 101, and is preferably within a few millimeters of the resonator 101. The buffer electronics on the circuit card 104 may also be coupled to a measuring device 124 such as an oscilloscope located outside of the specimen chamber 102.

The buffer electronics on the circuit card 104 act as a low impedance buffer to isolate the resonator 101 from any stray charges associated with the focused ion beam 108. The buffer electronics on the circuit card 104 may contain an oscillator circuit or similar circuit which can drive the resonator 101. The circuitry driving the buffer electronics on the circuit card 104 located outside the specimen chamber 102 are, for example, connected to the circuit card 104 by means of a connecting device 114 such as RG174 coaxial cable. The portion of the RG174 coaxial cable located inside the specimen chamber is preferably removed of the outer jacket to prevent charge build up when the specimen chamber 102 is depressurized and the focused ion beam 108 is operating. The connecting device 114 is also coupled to the measuring device 124 to simultaneously measure the output frequency of the resonator 101, while the resonator 101 is exposed to the focused ion beam 108.

In order to tune the resonator 101 shown in FIG. 1, the specimen chamber 102 is depressurized to preferably $10^{-4}$ to $10^{-6}$ Torr using a turbo pump or similar device. Pressures greater than $10^{-4}$ Torr could create problems in properly measuring the output frequency of the resonator 101. After the specimen chamber 102 is depressurized, the resonator 101 is exposed to the focused ion beam 108. Typically, the focused ion beam 108 has a beam current in the range of 1 picoamp-1 microamp, but is preferably less than 0.1 nanoamps. The focused ion beam 108 preferably has a beam current density of 5-10 Amps/cm$^2$ and a preferred beam diameter at segment 112 in the range of 5 nanometers-1000 nanometers. The dosage of ions in the focused ion beam 108 is preferably on the order of $10^{11}$-$10^{17}$ ions/cm$^2$. For this dosage of ions and a sputtering yield of 2-3, approximately $2 \times 10^{-4}$-$2 \times 10^{-2}$ monolayers of material are removed from the resonator 101. A sputtering yield is the amount of atoms removed from the resonator 101 by each ion of the focused ion beam 108. The focused ion beam 108 is preferably comprised of Ga$^+$ ions, and the Ga$^+$ ions preferably have energy in the range of 5 keV-30 keV. Other ions from silicon, aluminum, copper, boron, germanium, or other commercially available elements may also be used.

Figure 2:
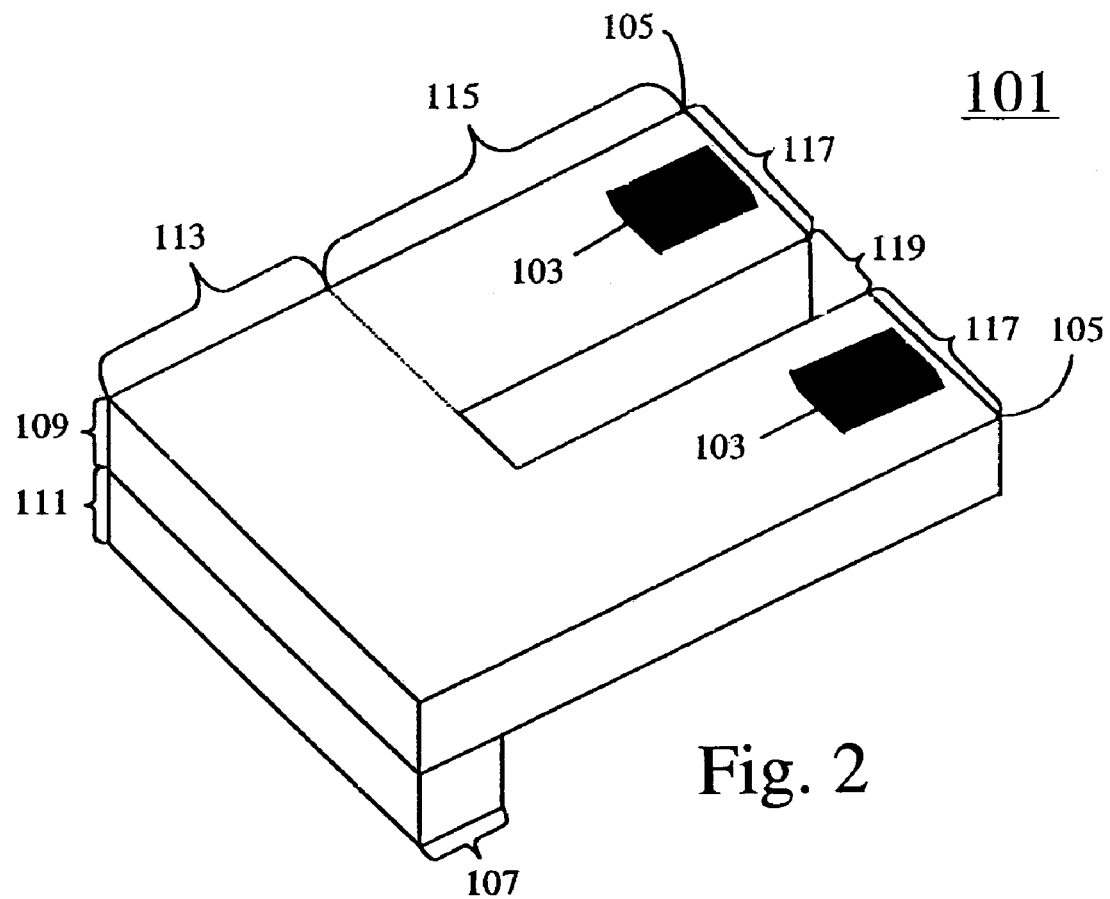
FIG. 2 shows an example of a MEMS device tuned using the present invention.

A resonator 101 having the shape of a tuning fork as shown in FIG. 2 can, for example, be tuned using the aforementioned method. Sections 107, 109, 111, and 119 of the tuning fork preferably have dimensions of l, sections 113 and 117 preferably have dimensions of 2l, and section 115 preferably has dimensions of 5l where l=0.05 microns. The resonator 101 is preferably comprised of quartz. The resonator 101 has tuning pads 103, preferably comprised of gold, located at the tips 105 of the resonator 101. By ablating a portion or all of the tuning pads 103, the resonant frequency of the resonator 101 can be adjusted. Limiting the energy of the Ga$^+$ ions to a range of 5 keV-30 keV will limit the penetration of the Ga$^+$ ions into the tuning pads 103 to less than 10 nanometers. This will prevent Ga$^+$ ions from completely penetrating the tuning pads 103 and entering the resonator 101.

Figure 3:
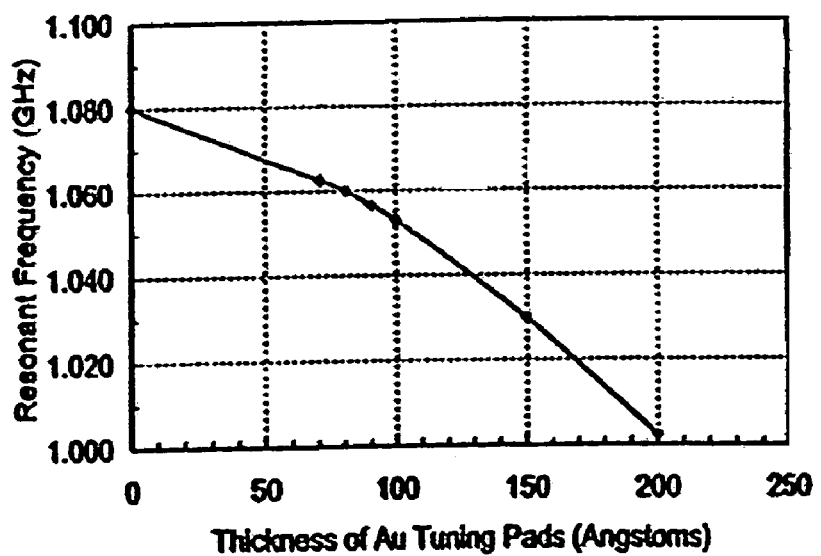
FIG. 3 shows a graph of the change in resonant frequency of the MEMS device in FIG. 2 after FIB micromachining.

FIG. 3 is a graph of how the resonant frequency of the resonator 101 shown in FIG. 2 changes as a function of the thickness of the tuning pads 103 when l=0.05 microns. The x-axis of the graph represents the thickness of the tuning pads 103, and the y-axis represents the resonant frequency. As shown in FIG. 3, when the tuning pads 103 have a thickness of about 200 Angstroms, the resonant frequency is about 1 GHz. When the tuning pads 103 are completely ablated, the resonant frequency is about 1.08 GHz. As a consequence, the graph of FIG. 3 clearly shows that the resonant frequency of the resonator 101 can be adjusted by ablating the tuning pads 103. It can be noted that the resonator 101 does not need to have tuning pads 103 to tune the resonant frequency. A portion of the resonator 101 may be ablated to tune the device.

SECOND EMBODIMENT

Figure 4:
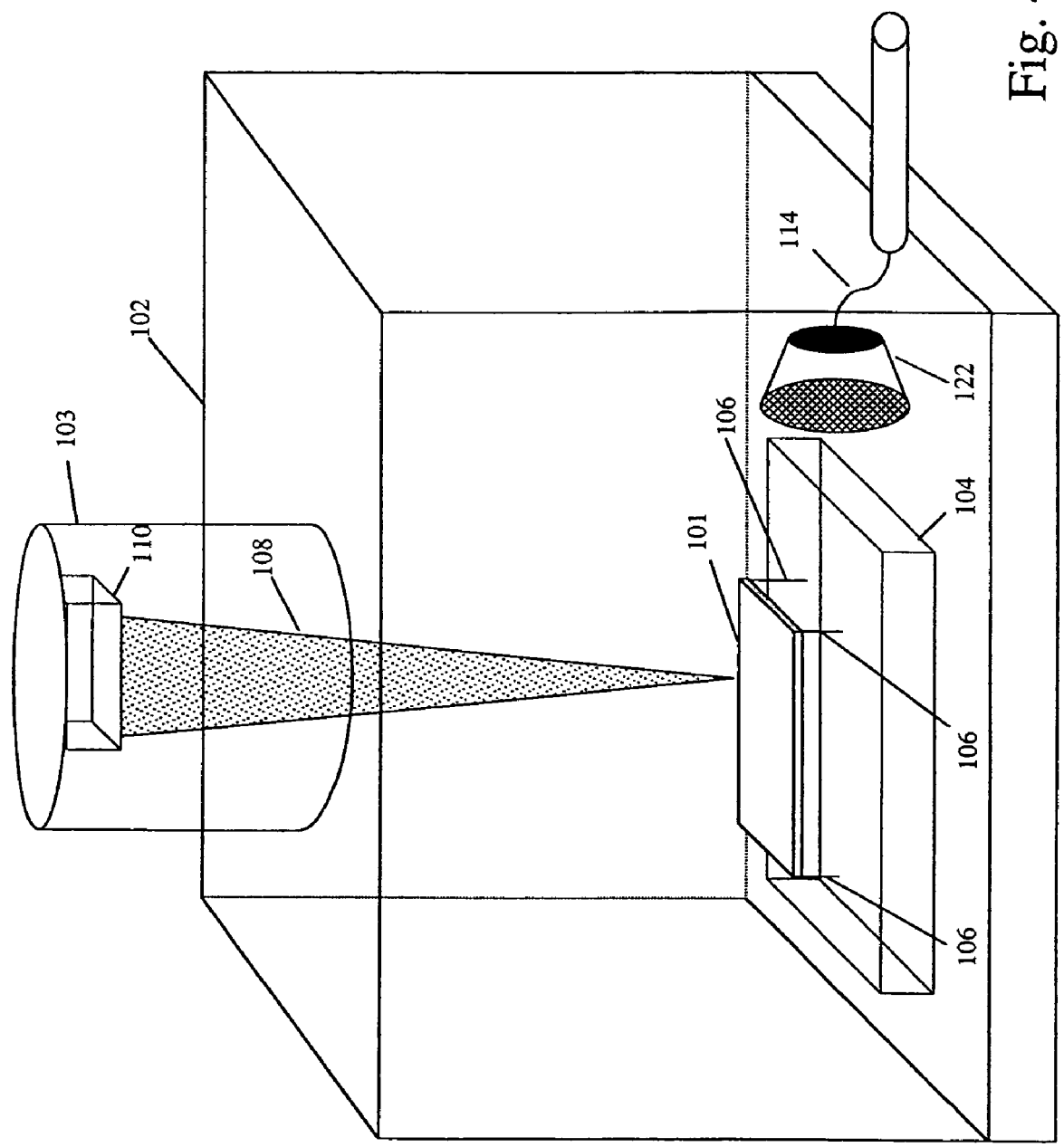
FIG. 4 shows a system according to a second embodiment of the present invention.

FIG. 4 shows a second embodiment of the present invention where a piezoelectric drive element 122, such as a speaker, is provided. Piezoelectric drive element 122 powers the resonator 101 using acoustic inertial forces. The piezoelectric drive element 122 is powered by a source outside the specimen chamber 102, not shown in the figure. In some instances electrically powering the resonator 101 may distort the frequency spectrum of the resonator 101, and as such, acoustic power is preferred for powering the resonator 101. Furthermore, the piezoelectric drive element 122 allows the detection of mass imbalances in the resonator 101. The piezoelectric element 122 is driven by circuitry outside the specimen chamber 102 and may be connected to the circuitry using the connecting device 114 discussed in the first embodiment. The piezoelectric drive element 122 preferably has a frequency output of DC to about 10-20 kHz. Mass imbalances result when the mass of the resonator 101 is not equally balanced. Mass imbalances can have direct adverse effect on the Q factor of the resonator 101, which is a measure of how well the resonator 101 responds to its resonant frequency and filters out other frequencies. When these mass imbalances are detected, they may then be corrected using the focused ion beam 108 and computer software to monitor where mass has been removed, and where it needs to be removed in order to balance the resonator 101. In this way, the piezoelectric drive element 122 can help achieve the desired resonant frequency and the Q, without distorting the frequency spectrum of the resonator 101. However, the circuit card 104, coupled with leads 106 to the resonator 101, is still used to detect the output frequency of the resonator 101.

THIRD EMBODIMENT

According to a third embodiment of the present invention, a system is provided which can be used in conjunction with the focused ion beam micromachining technique discussed in the first and second embodiments, to tune an array of resonators to have closely matched resonant frequencies for detecting chemical and biological agents.

Figure 5:
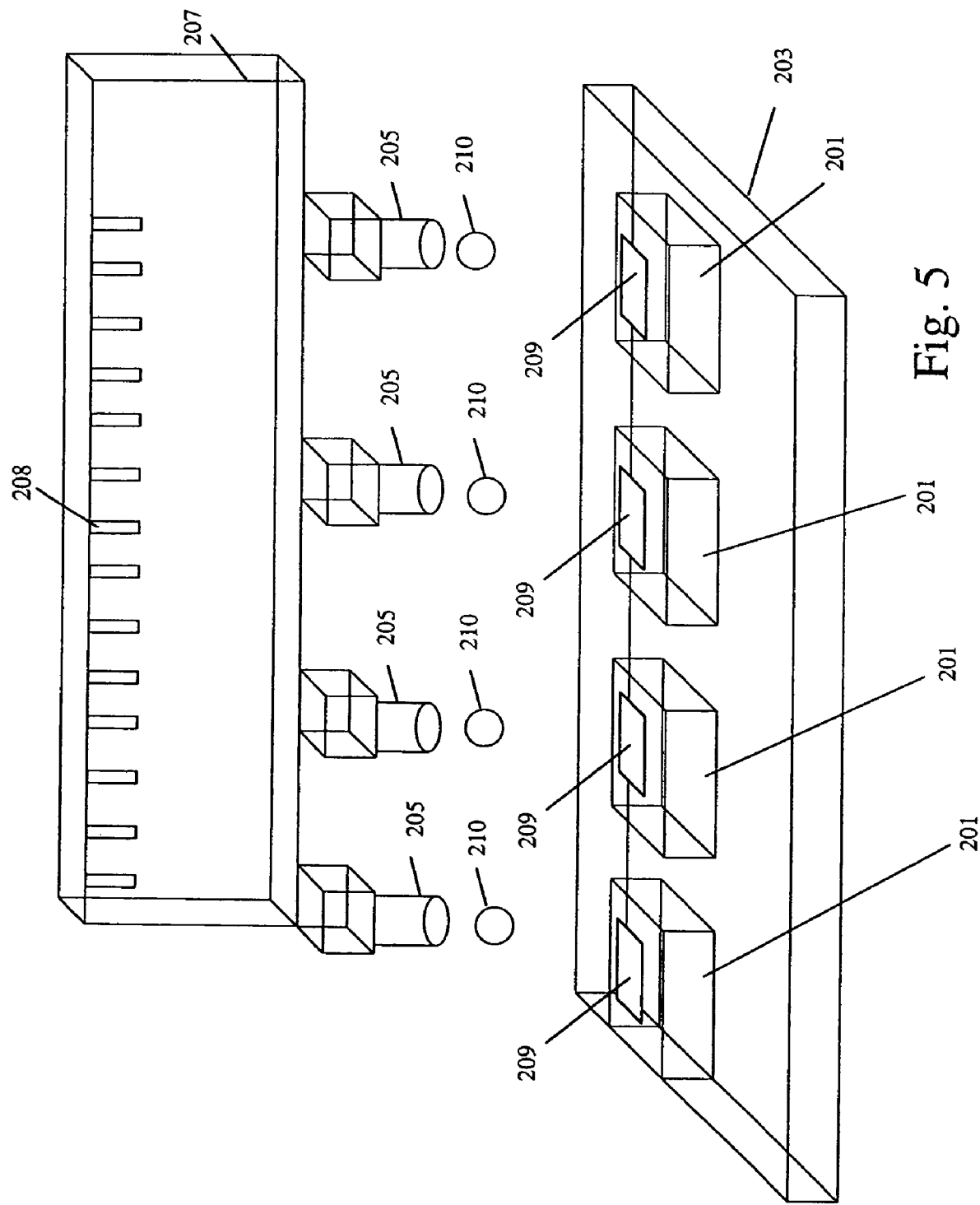
FIG. 5 shows a system used according to a third embodiment of the present invention.

FIG. 5 shows an exemplary model of the system. In this system several MEMS devices are provided. The MEMS devices are preferably resonators 201 and may be comprised of silicon, aluminum-nitride, silicon-carbide, gallium-nitride, quartz, or other variations of semiconductor material. In the preferred embodiment, the resonators 201 are comprised of quartz. The resonators 201 are provided on a support surface 203, and are located beneath a plurality of nozzles 205 on a printhead 207. The printhead 207 is part of a commercial ink-jet based proximal nano-doser. The basic evaluation kit available from Ink Jet Technologies is an example of an ink-jet based proximal nano-doser that is commercially available for this application. The printhead 207 has terminals 208 which are electrically controlled by a computer, and allow the nozzles 205 to dispense a specific amount of an active layer 209 onto the resonators 201, as schematically shown by means of droplets 210.

The active layer 209 is a material, which when in the presence of a certain chemical or biological agent, will bond to that chemical or biological agent, thereby changing the mass of the resonator 201. The active layer 209 may consist of amphiphiles such as dimyristylphosphatidylchlorine or dimyristylphosphatidylserine for detecting chemical agents such as ethanol, methanol, benzene, n-octane, n-butanole, or toluene. Certain polymers may be used to detect TNT, and metal hydrides may be used to detect hydrogen. Other active layers may consist of certain antibodies or oligonucleotides having a functionalized 5' hexyl spacer with a thiol group for detecting biological agents. Those skilled in the art will appreciate that several types of active layers may be used for detecting different chemical and biological agents.

By using the printhead 207 of a proximal nano-doser to selectively dispense active layers 209 on a plurality of resonators 201, it is possible to ensue that each resonator 201 placed on the surface 203 in a given run will receive equal amounts of an active layer 209. This also helps to alleviate frequency deviations between the resonators 201 caused by deviations in the amount of the active layer 209 which is dispensed on each resonator 201.

After the resonators 201 have been coated with an active layer 209, each resonator 201 may be placed in the specimen chamber 102 described in the first embodiment, preferably coupled to the circuit card 104 and exposed to the focused ion beam 108. Using focused ion beam micromachining to ablate a portion of the resonator 201 will reduce frequency deviations between the individual resonators 201. This will ensure that each resonator 201 is tuned to optimal performance and large offsets in frequencies between resonators will not saturate the front-end electronics.

FOURTH EMBODIMENT

A fourth embodiment of the present invention provides a system for tuning and packaging a plurality of resonators in-situ without breaking the vacuum of the specimen chamber. Shown in FIG. 6 is an exemplary system which accomplishes this goal.

Figure 6:
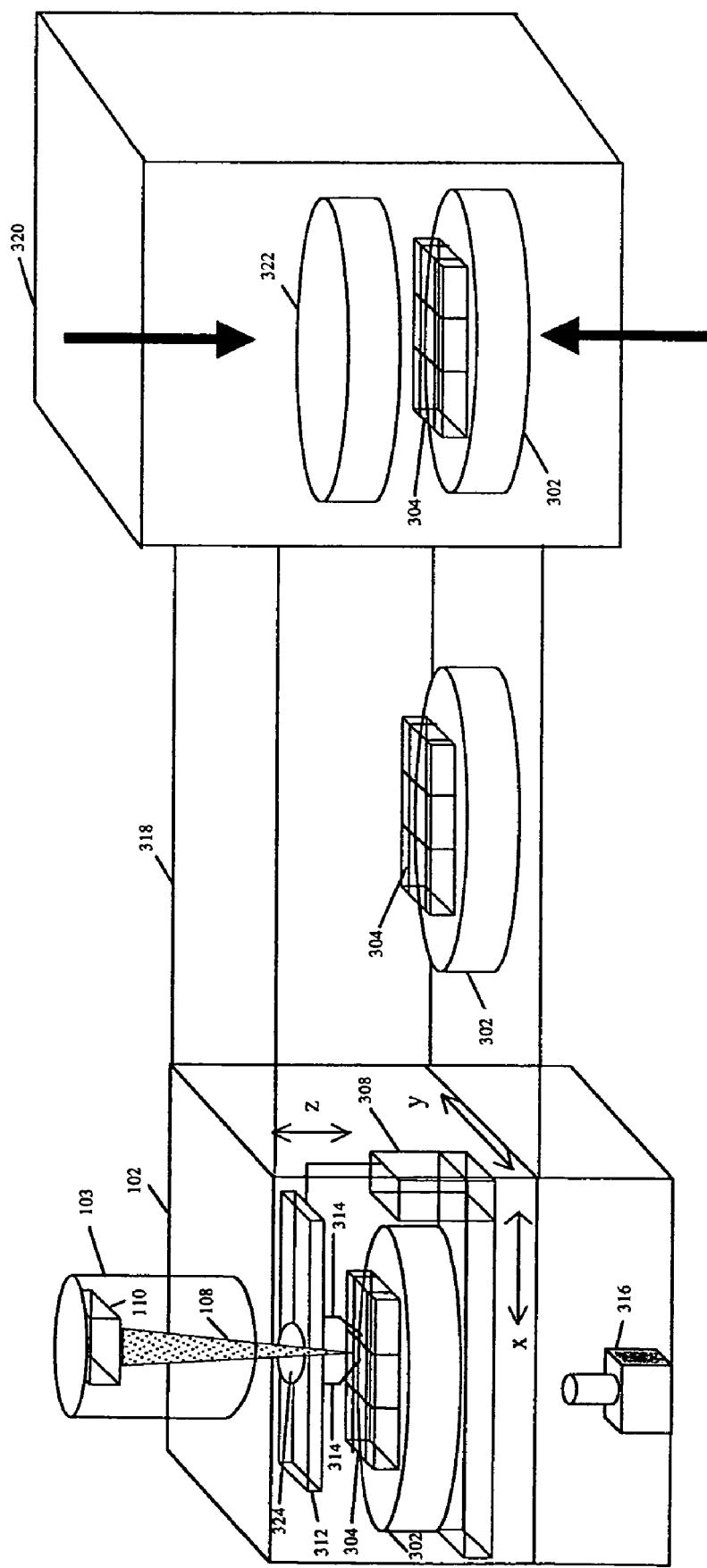
FIGS. 6 and 7 show a system for tuning a plurality of MEMS devices using the present invention, and packaging the MEMS devices in-situ.
Figure 7:
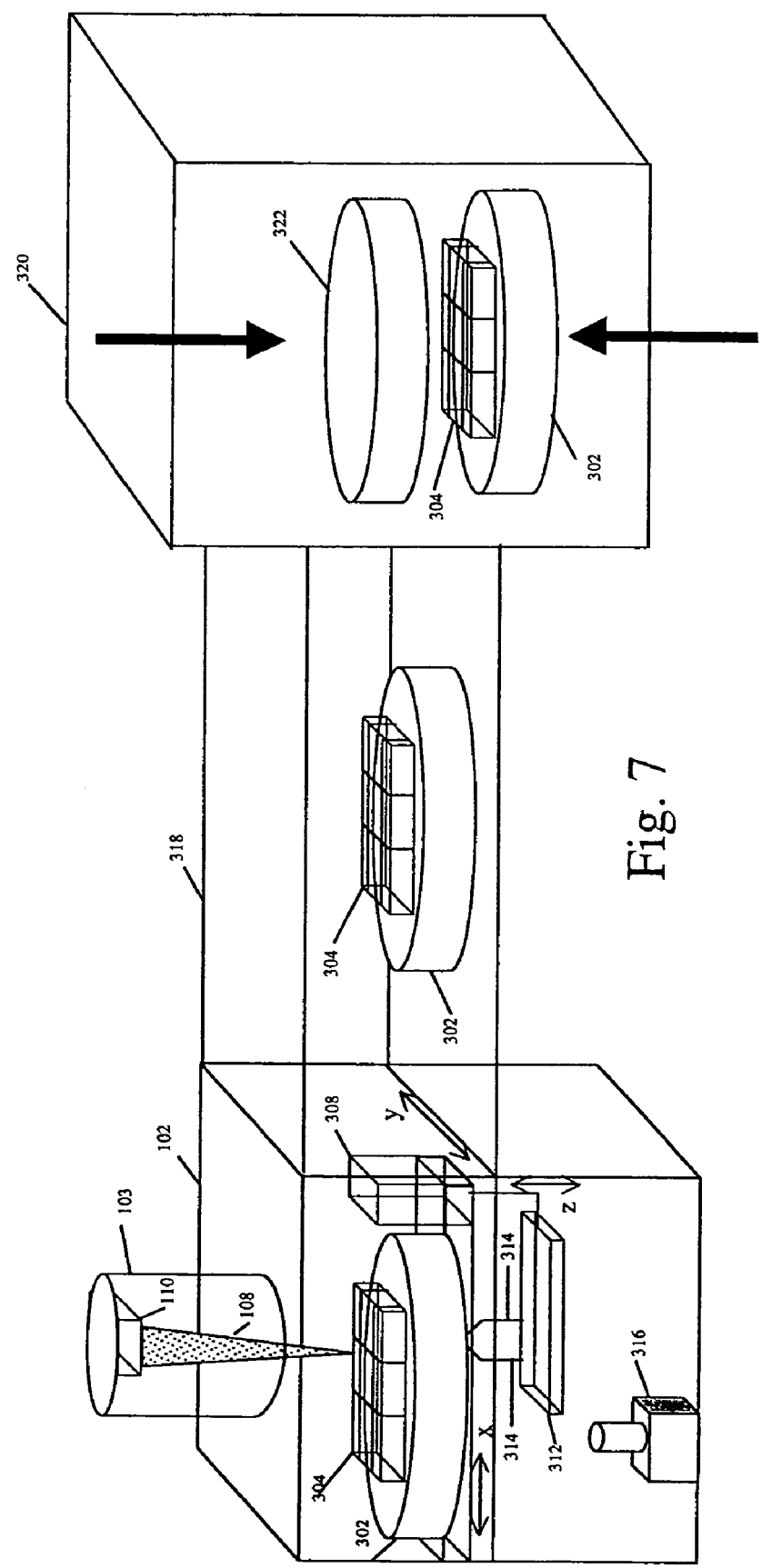

FIG. 6 shows on its left side a wafer 302 on which a plurality of resonators 304 are mounted. The wafer 302 is located on an XYZ-stage 308 in chamber 102, described in the first embodiment. The XYZ-stage 308 is used to move the wafer 302 and the plurality of resonators 304 in the XY-plane. The specimen chamber 102 also comprises a wafer probe card 312, and the liquid metal source 110 emitting the focused ion beam 108 discussed in the first embodiment. The wafer probe card 312 is connected to the XYZ-stage 308 such that the wafer probe card 312 may move in the z-plane. The wafer probe card 312 may be located between the plurality of resonators 304 and the focused ion beam 108 as shown in FIG. 6, or may be located below the wafer 302 as shown in FIG. 7. In the embodiments of FIG. 6, the wafer probe card 312 is positioned such that the focused ion beam 108 may travel through the hole 324 in the wafer probe card 312.

In order to tune the resonators 304 using the system shown in FIG. 6, the focused ion beam 108 is directed at a specific resonator in the plurality of resonators 304 located directly beneath the hole 324 in the wafer probe card 312. The function of the wafer probe card 312 is similar to the function of the circuit card 104 discussed in the first and second embodiments. The wafer probe card 312 has contacts 314 which connect to the resonator being tuned. The wafer probe card 312 provides power so that the resonator may be operating while simultaneously being tuned by the focused ion beam 108. The wafer probe card 312 also measures the output frequency of the resonator, so that the resonator is exposed to the focused ion beam 108 until the desired resonant frequency is achieved.

A camera 316 is also provided. After a resonator in the plurality of resonators 304 has been tuned using the focused ion beam 108, the contacts 314 are removed from the tuned resonator by moving the XYZ-stage 308 in the Z-direction. Then the XYZ-stage 308 moves the wafer 302 in the XY-direction so as to position the next resonator in the plurality of resonators 304 to be tuned beneath the focused ion beam 108. The wafer 302 contains a series of registration marks which can be viewed by the camera 316. The registration marks correspond to the position of each resonator in the plurality of resonators 304 on the wafer 302. When the XYZ-stage 308 is moving, the camera 316 observes the registration marks and indicates when a resonator is located beneath the focused ion beam 108. As soon as the resonator is beneath the focused ion beam 108, the contacts 314 of the wafer probe card 312 are connected to the resonator to be tuned using the XYZ-stage 308. The resonator is then exposed to the focused ion beam 108.

As already indicated, the system shown in FIG. 7 is similar to that shown in FIG. 6 except the wafer probe card 312 is located beneath the wafer 302 and does not contain a hole. In this system the wafer 302 contains a series of vias (not shown) filled with metal which connect the plurality of resonators 304 to the bottom side of the wafer 302. The contacts 314 of the wafer probe card 312 can then contact the metal filled vias to power the plurality of resonators 304 and measure the resonant frequency, while the resonator is exposed to the focused ion beam 108.

The specimen chamber 102 shown in FIGS. 6 and 7 may also be connected to a vacuum transport system 318 for transporting the tuned plurality of resonators 304 to a bonding chamber 320. The bonding chamber 320 uses a capping wafer 322 to package the plurality of tuned resonators 304 in-situ using various bonding techniques such as anodic, thermal compression, eutectic, or solder sealing. The vacuum transport system 318 and the bonding chamber 320 manufactured by Electronic Vision or Karl Suisse are commercially available products which accomplish this goal.

The foregoing description is only illustrative of the invention. Various alternatives and modifications can be devised by those skilled in the art without departing from the spirit of the invention. Accordingly, the present invention is intended to embrace all such alternatives, modifications, and variances which fall within the scope of the appended claims.

What is claimed is:

1. A method for tuning electro-mechanical devices using focused ion beam (FIB) micromachining, comprising the steps of:
   providing a plurality of electro-mechanical devices each electro-mechanical device having an adjustable resonant frequency;
   providing a focused ion beam;
   depositing an active layer on each electro-mechanical device of the plurality of electro-mechanical devices, the active layer allowing detection of chemical and biological agents; and tuning electro-mechanical devices of the plurality of electro-mechanical devices with the focused ion beam.

2. The method of claim 1, wherein the step of tuning is performed by removing portions of the electro-mechanical device with the focused ion beam.

3. The method of claim 1, wherein the step of tuning is performed by removing portions of the active layer with the focused ion beam.

4. The method of claim 1, wherein each electro-mechanical device of the plurality of electro-mechanical devices has a resonant frequency greater than 1 MHz.

5. The method of claim 1, wherein the active layer is comprised of a member selected from the group consisting of amphiphiles, dimyristylphosphatidylchlorine, dimyristylphosphatidylserine, polymers, metal hydrides, antibodies, and oligonucleotides.

6. The method of claim 1, wherein the step of depositing an active layer is performed with a printhead.

7. The method of claim 1, wherein the electro-mechanical device is a resonator.

8. The method of claim 7, wherein the resonator is comprised of a member selected from the group consisting of silicon, aluminum-nitride, silicon-carbide, gallium-nitride, and quartz.

9. The method of claim 1, wherein the electro-mechanical device is a MEMS device.

* * * * *